United States Patent [19]

Simon et al.

[11] 4,281,316
[45] Jul. 28, 1981

[54] SUCCESSIVE APPROXIMATION S/D CONVERTER WITH INHERENT QUANTIZATION ERROR CENTERING

[75] Inventors: David J. Simon, Saddle Brook, N.J.; Edward C. Costello, Scarsdale, N.Y.

[73] Assignee: The Singer Company, Little Falls, N.J.

[21] Appl. No.: 932,829

[22] Filed: Aug. 11, 1978

[51] Int. Cl.² ............................................. H03K 13/02
[52] U.S. Cl. ............................................. 340/347 SY
[58] Field of Search ............................... 340/347 SY

[56] References Cited

U.S. PATENT DOCUMENTS

| | | | |
|---|---|---|---|
| 3,295,125 | 12/1966 | Idelsohn | 340/347 SY |
| 3,516,084 | 6/1970 | Sacks | 340/347 SY |
| 3,564,539 | 2/1971 | Dew | 340/347 SY |
| 3,688,303 | 8/1972 | Metz | 340/347 SY |
| 3,713,141 | 1/1973 | Higgins | 340/347 SY |
| 4,017,846 | 4/1977 | Aramaki | 340/347 SY |

OTHER PUBLICATIONS

Staff of TLC Data Devices Corp. "Synchro Conversion Handbook" 1975 pp. 1–36.

*Primary Examiner*—Charles D. Miller
*Attorney, Agent, or Firm*—John C. Altmiller; Thomas W. Kennedy

[57] ABSTRACT

A comparator network in a successive approximation synchro-to-digital converter uses two comparators to determine the quadrant of the synchro angle and then uses one of these comparators as a steering voltage comparator to determine the less significant bits of the synchro angle. Fractions of the sine and cosine analog inputs are cross-coupled to the comparators to provide inherent quantization error centering.

12 Claims, 1 Drawing Figure

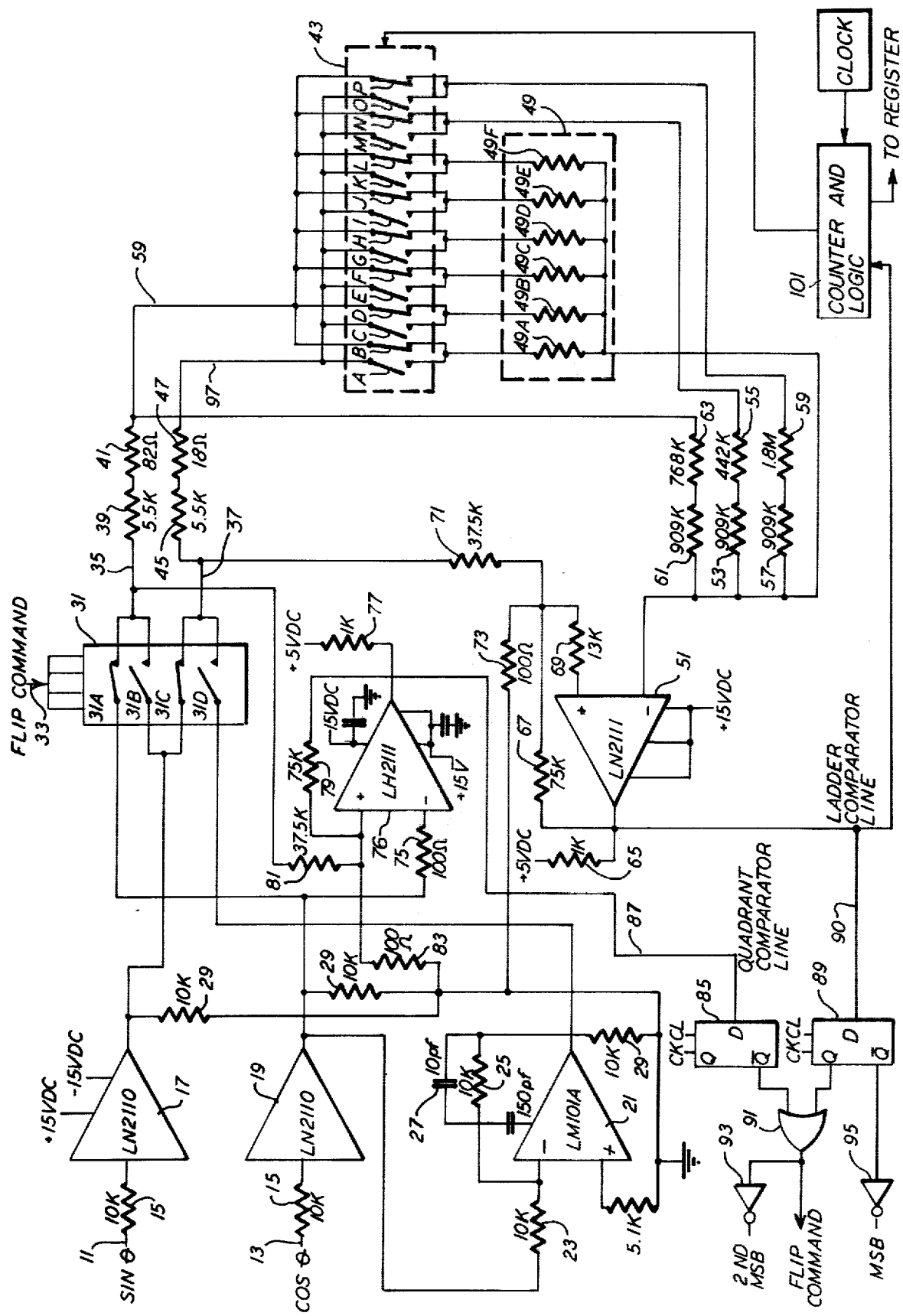

SUCCESSIVE APPROXIMATION S/D CONVERTER WITH INHERENT QUANTIZATION ERROR CENTERING

BACKGROUND OF THE INVENTION

This invention relates to analog to digital converters in general and more particularly to an improved synchro to digital converter with inherent quantization error centering.

In order to convert synchro or resolver voltages into a digital signal it is conventional to utilize successive approximation sampling synchro to digital converters. In the case of a resolver input the sine and cosine outputs generated thereby are fed directly, through appropriate buffering amplifiers, to the converter. In the case of a synchro, the synchro outputs are first fed through the well-known Scott-T transformer to convert them into sine and cosine outputs. Generally, demodulation is carried out to convert the AC synchro or resolver signal into a DC signal having magnitude proportional to the magnitude of the respective sine or cosine and a sign which is positive if the AC voltage is in phase and negative if out of phase.

Such converters are well-known and described for example in the DDC Synchro Conversion Handbook by ILC Data Devices Corporation (1975) at pp. 27 et seq. In the device disclosed therein, DC voltages are obtained by peak detecting and sampling of the sine and cosine voltages at the peak. The two voltages are supplied as inputs to a quadrant selector which selects which of the sine and cosine are to be provided to a sine multiplier and cosine multiplier respectively. The quadrant selector also is used to control the sign of the cosine. In the sine and cosine multipliers the outputs of the quadrant selectors are multiplied by the digital angle and the results of the multiplications summed in appropriate summing means to develop a steering voltage. The steering voltage is used to control a means for example, which provides input to a counter, the outputs of which are coupled into a register which stores the digital angle. The value in the counter is changed until the digital output angle corresponds to the angle represented by the analog inputs. At this point, the multiplication and summing results in a zero error signal. The steering voltage generated is a voltage proportional to sine $(\theta - \beta)$ where $\theta$ is the analog input angle and $\beta$ the digital output angle. The following trigonometric identity and nonlinear approximations are used:

$$\text{SIN } (\theta - \beta) = \text{SIN } (\theta) \text{ COS } \beta - \text{COS } (\theta) \text{ SIN } \beta$$

where SIN $\theta$, COS $\theta$ are analog input signals and:

$$\text{SIN } \beta \simeq \frac{K_1 N}{1 + K_1 N}$$
$$\text{COS } \beta \simeq \frac{K_1 (1 - N)}{1 + K_1 (1 - N)}$$
$$K_1 = .555$$
$$N/\overset{1}{\underset{0}{\mid}} \text{ as } \beta /\overset{90°}{\underset{0}{\mid}}$$

and whose intrinsic accuracy is ±1.9 arc minutes.

For carrying out the necessary quadrant selection the two most significant bits are used. Although these can be generated in the same manner as the rest of the bits, some prior art systems utilize a two segment conversion in which the two most significant bits are determined by a standard decoding of sine and cosine voltage polarities. When using such circuitry it must incorporate an offset of one-half of the least significant bit (LSB) in order to center the information such that the minimum inherent quantization error of one-half least significant bit is approached. Most typically, in the prior art, this centering has been accomplished using offsets generated from the DC voltages used in the system. The technique is sensitive to errors caused by maximum tolerances of both the DC voltages and the nominal line-to-line voltage of the interrogated synchro or resolver. Thus this prior art system cannot be easily adapted to synchros or resolvers having different output voltages.

SUMMARY OF THE INVENTION

It is the object of the present invention to provide a synchro to digital successive approximation converter whose inherent quantization error centering is independent of both DC voltage and line-to-line synchro voltage variations.

The present invention accomplishes this by the generation of a unique modification to the nonlinear approximations such that both the circuit complexity and maximum intrinsic error remain similar to those of prior art devices. In a ten bit converter, information is generated with a maximum error of 10 arc minutes at a conversion time of 150 micro seconds maximum.

The information is generated in two segments. A quadrant selection circuit determines the two most significant bits by standard decoding of the sine and cosine voltage polarities. Also incorporated in this circuitry is a one-half least significant bit offset implemented using well-known trigonometric identities and approximations. The example given is for a ten bit converter. Naturally, the invention is equally applicable to converters having greater or lesser resolution. Half of the least significant bit of a ten bit analog-to-digital angle converter represents 0.176 degrees. Thus, the following identities apply:

$$\text{SIN } (\theta + .176°) = \text{SIN } (\theta) \cos (.176°) + \cos (\theta) \text{ SIN } (.176°)$$
$$\simeq \text{SIN } (\theta) + .003 \cos (\theta)$$

Similarly cos $(\theta + 0.176°) \simeq \cos (\theta) - 0.003$ SIN $(\theta)$. Therefore, in accordance with the present invention implementation of the offset is accomplished by cross-coupling 0.003 of the sine and cosine functions with appropriate polarity.

In general, for an n-bit converter ½ LSB represents $360° \cdot (2^{-(n+1)})$ and the cross-coupling ratio is sin $[360°(2^{-(n+1)})]$. This cross-coupling ratio necessary to achieve a ½ LSB offset will be referred to as the "½ LSB ratio" throughout this disclosure. Further, one of the quadrant comparators is utilized as the steering voltage comparator.

The remainder of the bits are determined in conventional fashion by successive approximation utilizing the steering voltage comparator. Furthermore, in accordance with the present invention the steering voltage generation is modified as follows:

(1) In the first and third quadrant, 0.003 cosine $\theta$ is coupled into the comparator used to interpret the steering voltage. In the second and fourth quadrant, 0.003 sine $\theta$ is coupled into the comparator used to interpret the steering voltage. This couples a larger signal at the start of a quadrant than at the end of the quadrant.

(2) The ladder termination resistor is over-compensated such that, with all steps of the ladder network closed, its impedance is equal to 0.99795R instead of the nominal 1.00R. This new value of termination resistor has a proportionally larger effect at the end of a quadrant, when the network it is shunting has a comparable value, than at the start of a quadrant, when the network has effective impedance much lower than the resistor.

(3) The $K_1$ term for the sine approximation given above is reduced to 0.552 and the $K_1$ term for the cosine approximation increased to 0.558.

The net result is a nonlinear approximation technique having inherent quantization error centering, whose peak error is still 1.9 arc minutes. Furthermore, since the ratio required for cross-coupling during quadrant selection is the same as that required for the modified steering voltage, the same resistors and comparator can be used to implement both functions.

Because the offset is generated as a ratio of the measured sine $\theta$ and cosine $\theta$ inputs, it is independent not only of variations in DC voltages but also of nominal variations in the line-to-line voltage of the interrogated synchro.

A plot of the intrinsic accuracy of non-linear approximations used in the present invention showed an error curve with an error of $+1.9$ and $-1.6$ minutes. Although this was not the optimum balance, the accuracies are more than sufficient for the types of applications in which such converters are used.

BRIEF DESCRIPTION OF THE DRAWINGS

The single FIGURE is a schematic diagram of a portion of the successive approximation converter constructed according to the present invention.

DETAILED DESCRIPTION OF THE INVENTION

The circuits shown on the FIGURE include only those circuits in the successive approximation converter which are necessary for an understanding of the present invention. The remainder of the converter is as in the prior art. Sine and cosine voltages on lines 11 and 13 respectively are coupled through resistors 15 into buffer amplifiers 17 and 19 respectively. The sine and cosine, which are DC voltages, may be obtained by peak sampling in well-known fashion. Coupled to the output of the buffer amplifier 19 is an inverting amplifier 21. Amplifier 21 has its inverting input coupled to the output of amplifier 19 through a resistor 23. It also includes a feedback resistor 25 from its output to the inverting input. These two resistors will be of equal value to give unity gain with inversion. For purposes of compensation a capacitor 27 is coupled across resistor 25. The outputs of each of the amplifiers 17, 19 and 21 are coupled to ground through a resistor 29. The output of amplifier 17 is coupled to the input of sections 31B and 31C of a switch 31. The output of amplifier 19 is coupled to the section 31A of the switch and the output of amplifier 21 to the section 31D. The switch is a semiconductor analog switch and the portions 31A–D thereof are responsive to an input on the line 33. With a "0" logic level on line 33, the switches will be in the position shown, i.e., switches 31A and 31C are closed and 31B and 31D open. If the logic level at the line 33 changes to a "1", switches 31A and 31C will open and 31B and 31D close.

In the position shown, the output of amplifier 19 is being coupled through switch section 31A to a line 35. In the first and third quadrants, the output on line 35 represents sine $\theta$, and in the second and fourth quadrants the output on line 35 represents cosine $\theta$. Similarly, the output of amplifier 17 is coupled through switch section 31C to a line 37. In the first and third quadrants, the output on line 37 represents $-$cosine $\theta$ and in the second and fourth quadrants the output on line 37 represents sine $\theta$. Thus the outputs on lines 35 and 37 always represent different trigonometric functions and always have opposite polarities. These are the sine and cosine quantities utilized in the approximation equation above for finding sine $(\theta - \beta)$.

The output on line 35 is coupled through a resistor 39 and resistor 41 in series to the input of a plurality of switches in a switching module 43. Similarly, the output on line 37 is coupled through a resistor 45 and resistor 47 to a second set of switches in the module 43. These resistors alternate the voltages on lines 35 and 37 to establish the $K_1$ value in the equations given above. In the prior art, the value used for the approximation was 0.555 and the resistors used were typically 5.55 Kohms. In the present invention, resistors 39 and 45 are 5.50 K resistors, resistor 41 is 82 ohms and resistor 47 is 18 ohms, to give values of approximately 0.558 and 0.552 for the two constants.

The switches in module 43 are controlled by a counter 101 the outputs of which are input to a or register in the converter, shown only in block diagram form. The output of the first two switches, 43A and 43B, is coupled to a first resistor 49A in a resistor ladder network 49, the second two switches 43C and D to the second resistor 49B, the switches 43E and F are connected to a resistor 49C, the switches 43G and H to resistor 49D, the switches 43I and J to resistor 49E and the switches 43K and L to resistor 49F. All of the resistors in the ladder network have their other sides tied together and to the input of the ladder comparator 51. The switches 43M and N couple one of the inputs through resistors 53 and 55 to the inverting input of comparator 51 and switches 43O and P couple one of the inputs through resistors 57 and 59 to the inverting input. Together resistors 49, 53, 55, 57 and 59 form a binary weighted resistance ladder, with each step of the ladder having a resistance approximately twice as great at the preceding step. The input to the switches 43 on line 59 is also coupled through resistors 61 and 63 to the inverting input of comparator 51. Comparator 51 has its output coupled through a pull-up resistor 65 to $+5$ volts. It also has feedback to its non-inverting input through a resistor 67 and resistor 69. The output on line 37 is coupled through a resistor 71 and resistor 73 to ground. In the preferred embodiment, resistor 73 has a value of 100 ohms and resistor 71 a value of 37.5 K. This results in coupling into the non-inverting input of the comparator an offset voltage of 0.003 of the output on line 37. The output of the amplifier 19 is coupled through a resistor 75 to one input of the quadrant comparator 76. This comparator also has a pull-up resistor 77 to $+5$ volts DC and a positive feedback resistor 79. The output on line 35 is coupled through a resistor 81 and a resistor 83 to ground. Once again resistor 81 has a value of 37.5 K and resistor 83 a value of 100 ohms to cause 0.003 of the output on line 35 to be coupled into the non-inverting input of the comparator 76.

The input to the ladder comparator 51 will be sine $[\theta - \beta] =$ sine $[\theta]$ cosine $\beta -$ cosine $[\theta]$ sine $\beta$. This quantity is provided to the inverting input of the comparator 51. The non-inverting input is fed with the 0.003 of the voltage on line 37. In the implementation, $\beta$ is always positive. In order for the subtraction to be properly carried out, it is thus necessary that either sine $\theta$ or cosine $\theta$ have a negative sign in accordance with the above equation. In the first quadrant both the sine and cosine are positive. Thus, in the first quadrant the output of the amplifier 21 must be coupled through switch 31D and the output of amplifier 17 through switch 31B. In the second quadrant, the sine is positive and the cosine negative. Thus, if switches 31A and 31C are closed in the manner shown on the FIGURE, the subtraction will properly take place. In the third quadrant, both sine and cosine are negative, and so inversion is necessary, and in the fourth quadrant the sine is negative and the cosine positive, so no inversion is necessary. Thus, the switch section should be in the position shown for quadrants 2 and 4 and in the opposite position for quadrants 1 and 3. Correct positioning of switch 31 is achieved by logic circuitry which decodes the outputs of comparators 51 and 76. D-type flip-flop 85 has its data input connected to the output of quadrant comparator 76 on line 87. D-type flip-flop 89 has its data input connected to the output of ladder comparator 51 on line 90. The $\overline{Q}$ output of flip-flop 85 and the Q output of flip-flop 89 are inputs connected to exclusive-or gate 91. Inverter 93 inverts the output of exclusive-or gate 91. Inverter 95 inverts the $\overline{Q}$ output of flip-flop 89.

Initially the two flip-flops 85 and 89 are cleared so that their Q outputs are 0 and their $\overline{Q}$ outputs are 1. Exclusive-or gate 91 will have a "1" input and a "0" input, and will therefore generate a "1" output. This "1" output will cause switch 31 to switch so that switches 31B and 31D are closed. Thus initially the sine $\theta$ input will be on line 35 and the $-\cos\theta$ input will be on line 37. At this point the input voltage to comparator 76 will be $-\cos\theta + 0.003 \sin\theta$. Thus flip-flop 85 will have a "0" input in the first and fourth quadrant and a "1" input in the second and third quadrants. Therefore the $\overline{Q}$ output of flip-flop 85 will be "1" in the first and fourth quadrant and "0" in the second and third quadrant. Switches 43 will be initially set to connect the input on line 59 (the sine $\theta$ input) to the resistors in the resistance ladder. The input to comparator 51 will then be $-(K_1/K_1+1) \sin\theta - 0.003 \cos\theta$, plus the compensating voltage provided through resistors 61 and 63. Therefore flip-flop 89 will have a "0" input in the first and second quadrants and a "1" input in the third and fourth quadrants. Thus the Q output of flip-flop 81 will be "0" in the first and second quadrant and "1" in the third and fourth quadrant. The output of exclusive-or gate 91 will therefore be "1" in the first and third quadrants and "0" in the second and fourth quadrants.

At this point clock pulses cause flip-flop 85 and 89 to store their data input values. Inverter 93 inverts the output of exclusive-or gate 91 to produce a signal which represents the second most significant bit. Inverter 95 inverts the $\overline{Q}$ output of flip-flop 89 to produce a signal which represents the most significant bit.

In the first and third quadrants, the exclusive-or gate 91 will have a "1" output and the "flip command" on line 33 will close switches 31B and 31D. In the second and fourth quadrants, exclusive-or gate 91 will have a "0" output and the flip command on line 33 will close switches 31A and 31C.

The comparison network now proceeds to determine the remainder of the bits of the digital output angle. One conventional way of accomplishing this is to successively switch the resistors connected to switches 43 from line 59 to line 97, starting with the switch connected to resistor 49A and ending with the switch connected to resistors 55 and 59 by feeding clock pulses to counter 101 under control of the output on line 90.

After each step of the resistor ladder is switched, the output of comparator 51 is checked. Based upon the output of comparator 51 and the quadrant in which $\theta$ lies, logic circuitry in counter 101 either sets the corresponding digital output bit to "1" and leaves the resistive step switched to line 97 or sets the corresponding digital output bit to "0" and switches the resistive step back to line 59. In this manner, the value of the n−2 less significant bits are determined. It is evident that the comparator 51 serves two functions. In the beginning of the conversion cycle, along with the comparator 76, it decodes the polarities of the input voltages in order to find in which quadrant the angle lies, thus determining the two most significant bits of the digital output. This information is then stored and is used to generate the flip command. Thereafter, as the switches in the switch module 43 are changed in order to determine the value of the less significant bits, the ladder comparator 51 acts as a control to determine the value of these bits. The offsets that are necessary in these comparators which determine quadrant are obtained by taking a portion of the sine or cosine output on lines 35 and 37 and cross-coupling these signals to comparators 51 and 76. Since 0.003 of the value of the voltage on line 37 is coupled into the comparator 51, which is used to generate the steering voltage, this means that a larger signal is coupled in at the start of the quadrant than at the end of a quadrant. The ladder termination resistor, i.e., the resistor made up of resistors 61 and 63, is overcompensated such that with all legs of the network closed, the impedance of the network is equal to 0.9975R instead of the nominal 1.0R. This new value has a larger effect at the end of the quadrant where the effect of cross-coupling 0.003 of the voltage on line 37 is a minimum and a smaller effect at the start where the cross-coupled voltage is maximum. The net effect closely approximates a shift of ½ LSB across the entire quadrant. The cross-coupling of 0.003 of the voltage on lines 35 and 37 to comparators 51 and 76, together with the overcompensation of the termination resistor and the change of the $K_1$ terms for the sine and cosine approximations, enabled the peak error to be maintained at 1.9 arc minutes, while at the same providing inherent quantization error centering.

What is claimed is:

1. In a successive-approximation sampling resolver or synchro to digital converter which converts analog signals representing sin $\theta$ and cos $\theta$ to an n-bit digital signal representing $\theta$, a comparison network which comprises:

means for inverting the cos $\theta$ input to generate a $-\cos\theta$ input;

first switching means having a first switching path which connects the sin $\theta$ input to a first switch output and the $-\cos\theta$ input to a second switch output and having a second switching path which connects the cos $\theta$ output to the first switch output and the sin $\theta$ output to the second switch output;

first error centering means for multiplying the first switch output voltage by the ½ LSB ratio to generate a first error centering output;

quadrant comparator means having the cos θ input as an inverting input and having the first error centering output as a non-inverting input;

first attenuation means for attenuating the first switch output;

second attenuation means for attenuating the second switch output;

a binary weighted resistance ladder having n−2 resistive steps;

second switching means for selectively connecting the first or second attenuated switch outputs to each of the steps of said resistance ladder;

second error centering means for multiplying the second switch output by the ½ LSB ratio thereby generating a second error centering output;

third error centering means having as an input the attenuated first switch output and having as an output a resistance ladder compensating voltage;

ladder comparator means having as an inverting input the sum of said resistance ladder outputs and the compensating voltage and having as a non-inverting input the second error centering output; and logic means for initially connecting the first switching path, decoding the initial output of the quadrant comparator means and the ladder comparator means to determine the two most significant bits of θ and then connecting either the first or second switching paths, and thereafter successively connecting steps of said resistance ladder to the second attenuated switch output and sensing the output of the ladder comparator means to determine the n−2 less significant bits of θ.

2. The comparison network of claim 1, wherein said first error centering means comprises a first resistance divider network having resistance values such that the voltage across a first output resistor represents the first switch output voltage multiplied by the ½ LSB ratio.

3. The comparison network of claim 2, wherein said second error centering means comprises a second resistance divider network having resistance values such that the voltage across a second output resistor represents the second switch output voltage multiplied by the ½ LSB ratio.

4. The comparison network of claim 3, wherein said third error compensation means comprises a compensating resistance having a value such that with all legs of said resistance ladder closed, the impedance of the ladder is slightly less than the nominal 1.00R.

5. The comparison network of claim 4, wherein the digital signal representing θ has 10 bits, and the first resistance divider network has a ratio between resistances which cross-couples 0.003 of the first switch output voltage to the non-inverting input of the quadrant comparator means.

6. The comparison network of claim 5, wherein the second resistance divider network has a ratio between resistances which cross-couples 0.003 of the second switch output voltage to the non-inverting input of the ladder comparator means.

7. The comparison network of claim 6, wherein said compensating resistance has a value such that with all legs of said resistance ladder closed, the impedance is 0.99795R instead of the nominal 1.00R.

8. The comparison network of claim 1, wherein said first attenuation means comprises a first attenuation resistor which effectively establishes a $K_1$ term of 0.558 and second attenuation means comprises a second attenuation resistor which effectively establishes a $K_1$ term of 0.552.

9. A method for converting analog signals representing sin θ and cos θ to an n-bit digital signal representing θ, which comprises:

inverting the cos θ input to generate a −cos θ input;

initially connecting the sin θ input to a first switch output and the −cos θ input to a second switch output;

generating a first error centering voltage which equals the first switch output multiplied by the ½ LSB ratio;

subtracting the cos θ input from the first error centering voltage to generate a quadrant comparator voltage;

attenuating the first switch output to produce a first attenuated switch output;

attenuating the second switch output to produce a second attenuated switch output;

initially connecting the first attenuated switch output to the steps of a binary weighted resistance ladder;

generating a second error centering voltage which equals the second switch output multiplied by the ½ LSB ratio;

shunting said resistance ladder with a large resistance connected to the first attenuated switch output to generate a resistance ladder compensating voltage;

summing said resistance ladder output voltages and the resistance ladder compensating voltage to generate a summed voltage;

subtracting the summed voltage from the second error centering voltage to generate a ladder comparator output voltage;

decoding the quadrant comparator output and the ladder comparator output to determine the quadrant in which θ lies, thereby determining the two most significant bits of the digital output;

connecting the sin θ input to the first switch output and the −cos θ input to the second switch output if θ is in the first or third quadrant, otherwise connecting the cos θ input to the first switch output and the sin θ input to the second switch output;

successively switching the steps of said resistance ladder to the second switch output; and testing the polarity of the ladder comparator output voltage to determine the value of the n−2 less significant bits of the digital output.

10. In a successive approximation synchro-to-digital converter which includes first and second comparators having as respective inputs voltages corresponding to the sine and cosine of the synchro angle and providing outputs which are decoded to determine the quadrant in which the angle lies and which also includes a steering voltage comparator receiving inputs from a ladder network and providing an output to control selection of the less significant bits, the improvement comprising:

a single comparator used as one of the quadrant comparators and as the steering voltage comparator; and means to provide an error-centering compensation signal to said comparator.

11. In a successive approximation synchro-to-digital converter for converting analog inputs representing sin θ and cos θ to a digital output representing θ, which uses quadrant selection circuitry to determine the quadrant in which θ lies and then uses a binary weighted resistance ladder connected to a ladder comparator to determine the n−2 less significant bits of the digital output, the improvement which comprises:
 selection means for selecting −cos θ as an error compensating signal in the first and third quadrants and selecting sin θ as an error compensating signal in the second and fourth quadrants;
 means for multiplying the error centering voltage by the ½ LSB ratio to provide an error centering signal to the ladder comparator; and
 resistive means shunting said resistive ladder to slightly reduce the nominal 1.00R impedance of the ladder with all steps of the ladder closed.

12. In the successive approximation synchro to digital converter of claim 11 for generating a 10 bit digital output signal representing θ, the improvement further comprising:
 using 0.003 as the ½ LSB ratio; and
 shunting said resistance ladder with a resistance such that the impedance of the ladder with all steps closed is 0.99795R.

* * * * *